(12) United States Patent
Behammer

(10) Patent No.: US 7,618,851 B2
(45) Date of Patent: Nov. 17, 2009

(54) METHOD FOR THE PRODUCTION OF A SEMICONDUCTOR COMPONENT HAVING A METALLIC GATE ELECTRODE DISPOSED IN A DOUBLE-RECESS STRUCTURE

(75) Inventor: Dag Behammer, Ulm (DE)

(73) Assignee: United Monolithic Semiconductors GmbH, Ulm (DE)

( * ) Notice: Subject to any disclaimer, the term of this patent is extended or adjusted under 35 U.S.C. 154(b) by 400 days.

(21) Appl. No.: 11/800,769

(22) Filed: May 7, 2007

(65) Prior Publication Data

US 2007/0264763 A1 Nov. 15, 2007

(30) Foreign Application Priority Data

May 15, 2006 (DE) ............ 10 2006 022 508

(51) Int. Cl.
*H01L 21/8232* (2006.01)
*H01L 21/44* (2006.01)

(52) U.S. Cl. ............ 438/142; 438/167; 438/172; 257/E29.246; 257/194

(58) Field of Classification Search .......... 257/E29.246, 257/194, 284; 438/167, 142, 172
See application file for complete search history.

(56) References Cited

U.S. PATENT DOCUMENTS

| 5,358,885 | A | * | 10/1994 | Oku et al. ............ 438/571 |
| 5,556,797 | A | | 9/1996 | Chi et al. |
| 5,641,977 | A | | 6/1997 | Kanamori |
| 5,796,132 | A | | 8/1998 | Nakano et al. |
| 6,087,256 | A | | 7/2000 | Wada |
| 6,180,968 | B1 | | 1/2001 | Kasahara et al. |
| 2004/0063303 | A1 | * | 4/2004 | Behammer ............ 438/585 |
| 2004/0082158 | A1 | | 4/2004 | Whelan et al. |

OTHER PUBLICATIONS

European Search Report in German.

* cited by examiner

*Primary Examiner*—Thanh V Pham
*Assistant Examiner*—Mohammad Choudhry
(74) *Attorney, Agent, or Firm*—Collard & Roe, P.C.

(57) ABSTRACT

The production of a microelectronic component, particularly a pHEMT, having a T-shaped gate electrode in a double-recess structure uses a production method for self-adjusting alignment of the two recesses of the double-recess structure and of the gate foot of the gate electrode.

8 Claims, 3 Drawing Sheets

METHOD FOR THE PRODUCTION OF A SEMICONDUCTOR COMPONENT HAVING A METALLIC GATE ELECTRODE DISPOSED IN A DOUBLE-RECESS STRUCTURE

BACKGROUND OF THE INVENTION

1. Field of the Invention

The invention relates to a method for the production of a semiconductor component, particularly a pHEMT field effect transistor, having a metallic gate electrode disposed in a double-recess structure.

2. The Prior Art

Semiconductor elements having a gate electrode disposed in a double-recess structure, are known in various embodiments.

In U.S. Pat. No. 5,796,132, the two recesses are assigned to one another by adjustment, and masked by a resist mask or SiN hard mask during etching. Furthermore, isolation is possible, in the case of a pHEMT (Pseudomorphic High Electron Mobility Transistor), only by means of over-etching on a stop layer. This results in cavities that later can no longer be passivated. The T-shaped gate head is formed, in the method shown, by the etching of a metallization deposited on the entire area. In U.S. Pat. No. 5,556,797, the two recesses are formed self-adjusted relative to one another, but it is not possible to form a low-ohm T-shaped gate head, which is, however, required for high-frequency applications. The same also holds true for U.S. Pat. No. 5,641,977.

U.S. Patent Application Publication No. 2004/0082158 A1 describes a method in which several photo-resist layers are deposited onto the semiconductor layer sequence, in which layers structures for the gate head are prepared, using the lift-off method, for the subsequent production of a T-shaped gate electrode. In the lowermost resist layer, deposited onto the highly doped contact layer of the semiconductor layer sequence, an opening that determines the structure of the gate foot is produced. The resist layers are maintained during the subsequent method steps, up to vapor deposition of the gate metal. Under the lowermost resist layer, a recess structure is produced in the contact layer, by under-etching, up to a barrier layer, and gate metal is deposited through the opening of the lowermost resist layer, to form the gate foot on the barrier layer, and, at the same time, deposited in the structures of the upper resist layers, to form the gate head. The gate electrode is exposed by dissolving the resist layers. Afterwards, ohmic contacts are still produced on the highly doped contact layer.

SUMMARY OF THE INVENTION

It is an object of the invention to provide an advantageous method for the production of a semiconductor component having a metallic gate electrode disposed in a double-recess structure.

The invention comprises a method for the production of a microelectronic component of a T-shaped metallic gate electrode, having a broader gate head and a narrower gate foot, which is disposed in a double-recess structure. A semiconductor layer sequence for an HEMT transistor is deposited. The sequence includes a channel layer, a low-doped shielding layer above the channel layer, and a highly doped contact layer above the shielding layer. At least one first auxiliary layer is deposited above the contact layer, and a first opening that determines the structure of the gate foot is produced in the first auxiliary layer. The broad recess of the double-recess structure is produced by under-etching the auxiliary layer up to the shielding layer.

Dielectric material for another auxiliary layer is deposited onto the shielding layer through the first opening in the broad recess, and a second opening in the additional auxiliary layer, up to the shielding layer, is produced by anistropic etching, with the first opening as a mask. The narrow recess is produced by under-etching the additional auxiliary layer on both sides of the second opening. The deposition of gate metal for the gate foot takes place through the second opening, into the narrow recess.

In one embodiment, silicon nitride is deposited as the material for the additional auxiliary layer. Preferably, the material for the additional auxiliary layer is deposited according to a PECVD (Plasma Enhanced Chemical Vapor Deposition) method.

In another embodiment, the broad recess is filled with a polymerizable filler after deposition of the additional auxiliary layer, and this filler is polymerized in the broad recess. The second opening is also produced in the polymer. The auxiliary layer above the polymer is removed before deposition of the gate metal, and gate metal for the gate head is deposited onto the polymer.

In another embodiment, an intermediate layer is deposited between the contact layer and the first auxiliary layer, and the etching of the broad recess takes place in two steps: In a first step, an opening that is wider as compared with the first opening is produced in the intermediate layer, under the first auxiliary layer; and in a second step, this opening is used as a mask for etching the broad recess in the contact layer.

In one embodiment, the at least one resist layer is deposited before under-etching of the additional auxiliary layer for production of the narrow recess, and an opening is produced in this layer as a mask for the gate head.

After deposition of the gate metal, the layers that have remained above the semiconductor layers are preferably removed, and a passivation layer is deposited, having such a thickness that closed cavities are formed below overhanging gate head regions.

The production of the double-recess structure advantageously takes place, by means of the method according to the invention, with self-adjusting positioning of the broad and the narrow recess, in several steps, wherein structures that are produced in intermediate steps can advantageously serve as the masking for subsequent etching steps. A self-centering position for the gate foot also occurs within the narrow recess.

In particular, not only can the position of the broad recess be established by under-etching the first auxiliary layer, with the first opening in the first auxiliary layer as a hard mask, but also the position of the narrow recess can be established by transferring the structure of the first opening to another opening of another auxiliary mask, and under-etching it. In this way, a reliable self-adjusting reciprocal lateral alignment of the broad and the narrow recess can be achieved.

It is particularly significant that another auxiliary layer is deposited through the first opening, into the broad recess, and there, in particular, onto the shielding layer, and that the additional opening produced in this additional auxiliary layer serves as a hard mask for etching the narrow recess. Preferably, the broad recess is filled with a liquid filler material that can solidify, preferably a polymerizable material, after deposition of the additional auxiliary layer, and the material solidifies, particularly into a polymer. The transfer of the structure of the first opening then advantageously takes place into a second opening in the polymer and the additional auxiliary layer that lies between the polymer and the shielding layer.

In an advantageous further development, the first auxiliary layer is removed above the polymer, or preferably in total, before deposition of the gate metal, and gate metal for the gate head is deposited onto the polymer.

The production of structures, including the production of openings in layers and the exposure of recesses or structures, takes place in conventional manner, by means of multiple compilation and use of known etching agents, which can particularly be selected and used with material selectivity.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

In the following, the invention will be described in greater detail using a preferred exemplary embodiment, making reference to the figures, FIG. 1a to 1i, in method stages that follow consecutively.

The method according to the invention includes integration, which can be scaled and self-adjusted to a high degree, for defining the gate region with gate foot and gate head. In this connection, the gate foot can possess dimensions of 70-600 nm, for example, while the gate head can typically be broader, towards both sides, by 50-300 nm. The gate foot is centered in a narrow recess in the shielding layer, which recess in turn is centered in the broad recess in the highly doped contact layer. In this connection, the broad recess is typically broader than the narrow recess, on both sides, by 200 mm-1000 mm.

Figure 1A:
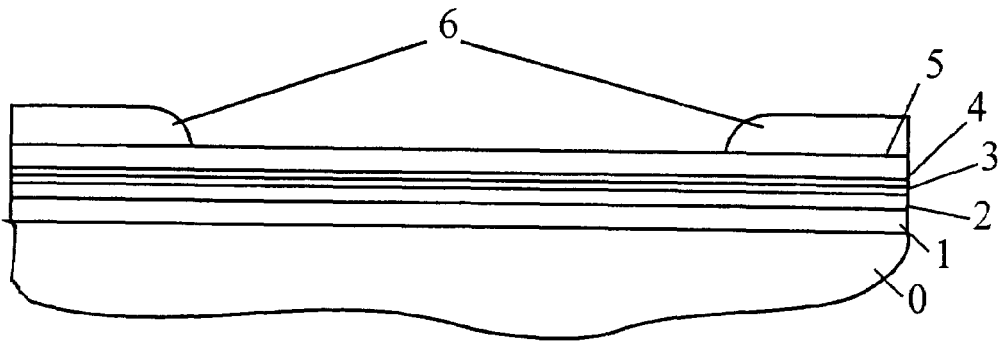
FIGS. 1a-1i show the different steps of the method according to the invention, in consecutive order.

Proceeding from the GaAs substrate 0, layers 1-5 in FIG. 1a define the vertical profile of a field-effect transistor, particularly a pHEMT high-frequency power field-effect transistor, which can vary in terms of a thickness structure and elemental structure, as a function of the use. The layer thickness ratios should not be understood as being to scale. Fundamentally, 1 represents the buffer, 2 forms the channel layer for the two-dimensional electron gas, 3 is a barrier layer, preferably having a stop layer on top, 4 is a low-doped shielding layer, which also preferably ends with a stop layer on top, and the layer 5, as the uppermost semiconductor layer, forms a highly doped contact layer for low-ohm component contacting. Layers 4 and 5 preferably consist of GaAs, and it is advantageous if the stop layers consist of AlAs or InGaP.

Figure 1B:
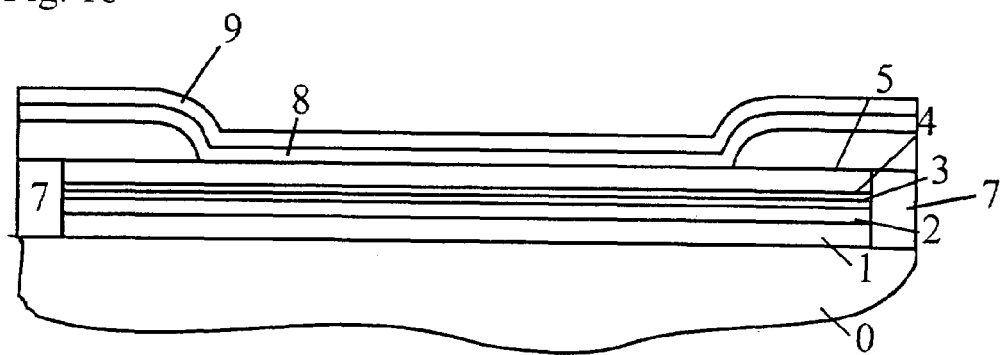

After ohmic contacts 6 are defined on contact layer 5 according to FIG. 1a, deposition of a dielectric intermediate layer 8, preferably an $SiO_2$ layer, and a dielectric auxiliary layer 9, preferably a silicon nitride (SiN) layer, takes place, preferably by means of PECVD. Lateral insulation of the transistors takes place by photo-resist-masked implantation, to form insulated field areas 7 (FIG. 1b).

Figure 1C:
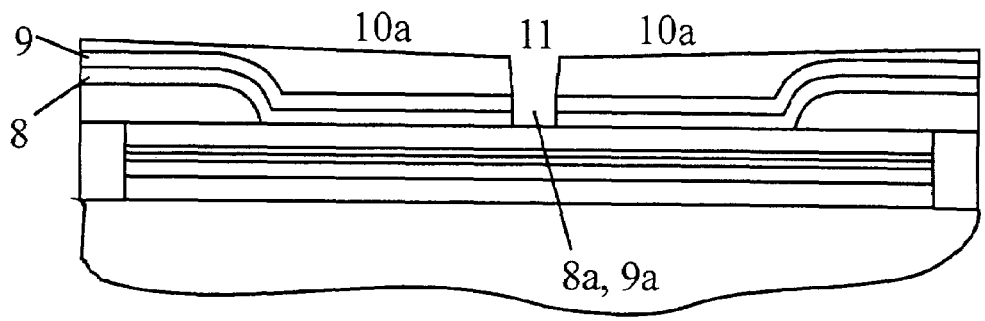

In a next lithography process step, a photo-resist layer is applied, and a lithography mask having a structure for the gate foot is adjusted relative to the ohmic contacts. After exposure and development of the photo resist, the opening 11 is formed in photo resist 10a, which opening is transferred into the double layer of first auxiliary layer 9 and intermediate layer 8 by dry-chemical plasma etching, so that openings 9a and 8a, respectively, are formed in these layers (FIG. 1c). The photo resist 10a is then removed again.

Figure 1D:
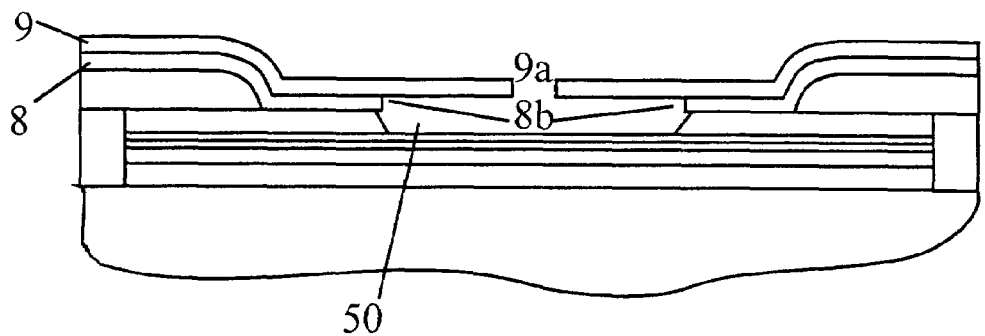

In a subsequent wet-chemical etching of the intermediate layer, selective relative to first auxiliary layer 9 and contact layer 5, opening 8a in intermediate layer 8 is widened to make a larger opening 8b, the lateral width of which can be well adjusted by way of the parameters of the etching process, particularly its duration. Opening 8b in the intermediate layer serves as a hard mask, in a subsequent etching step, for etching broad recess 50 in contact layer 5. The etch stop layer between shielding layer and contact layer limits the etching vertically, and the structure according to FIG. 1d is formed.

Afterwards, another auxiliary layer, preferably SiN, is deposited. This deposition takes place as a uniform layer 90a on the first auxiliary layer and, through the opening 9a in the first auxiliary layer, also as a hard mask layer 90b, into the cavity formed by opening 8b and broad recess 50, below the first auxiliary layer, and there particularly above shielding layer 4 and at the flanks of the opening in the first auxiliary layer, now referred to as 9b. By adjusting the parameters of the deposition of the additional auxiliary layer, which is preferably deposited using a PECVD method, the additional auxiliary layer 90b is deposited onto shielding layer 4 with a greater width, as compared with opening 9a, or also on the entire inside surface of the cavity. The layer thickness of additional auxiliary layer 90b on the shielding layer is less than the layer thickness of additional auxiliary layer 90a on the first auxiliary layer.

Figure 1E:
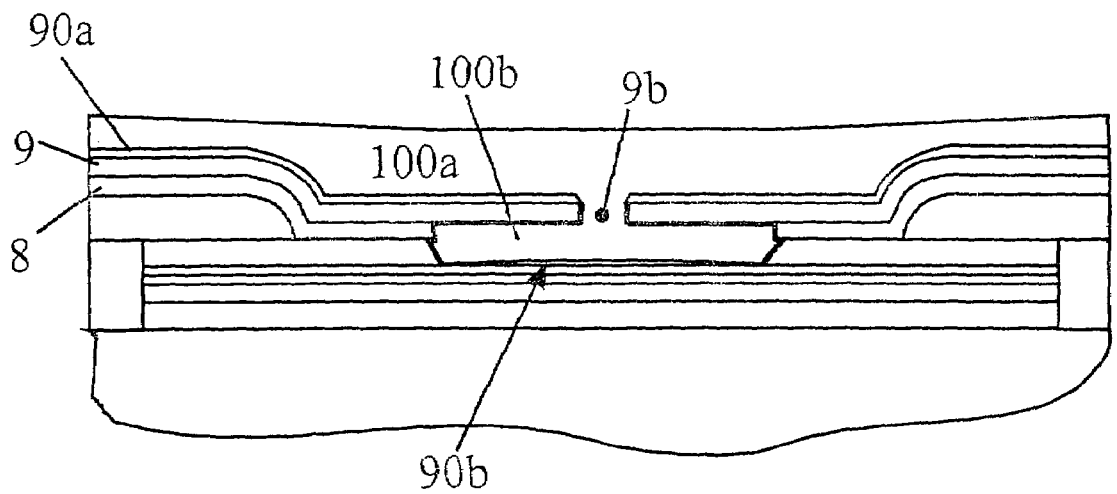

It is advantageous if a polymer, particularly BCB (benzocyclobutene), is then applied, which not only forms a layer 100a on first auxiliary layer 9, but also, with a portion 10b, fills the opening 9b and the cavity formed under the first auxiliary layer by means of opening 8b and broad recess 50 (FIG. 1e).

Figure 1F:
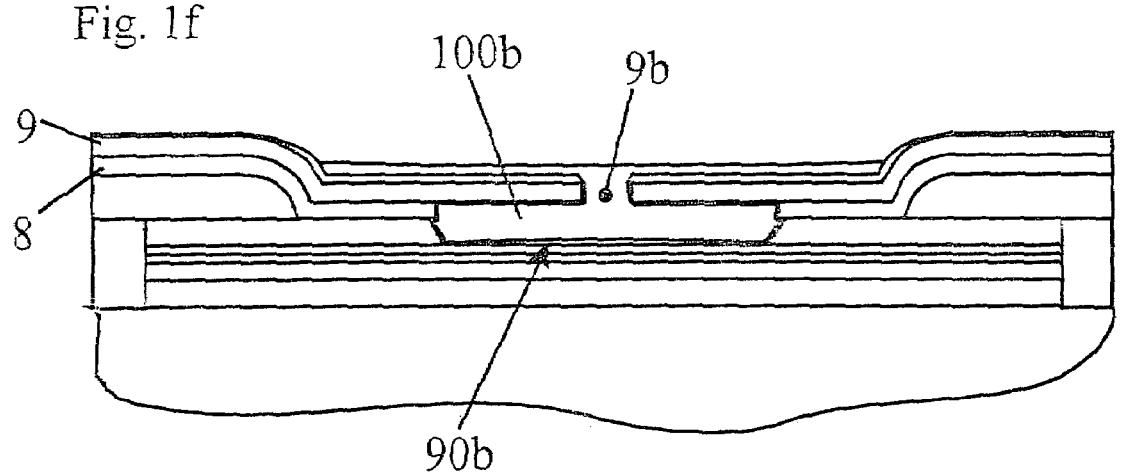
Figure 1G:
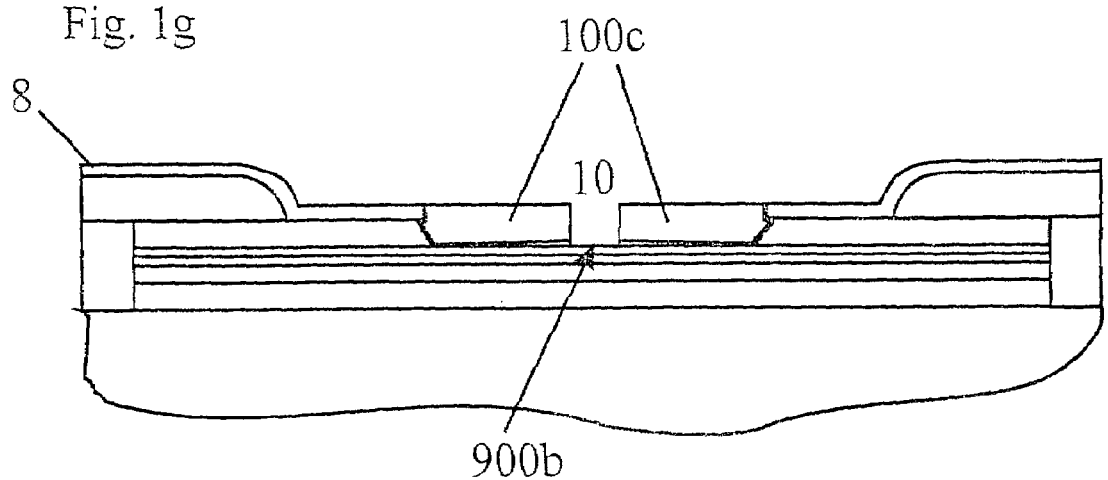
Figure 1H:
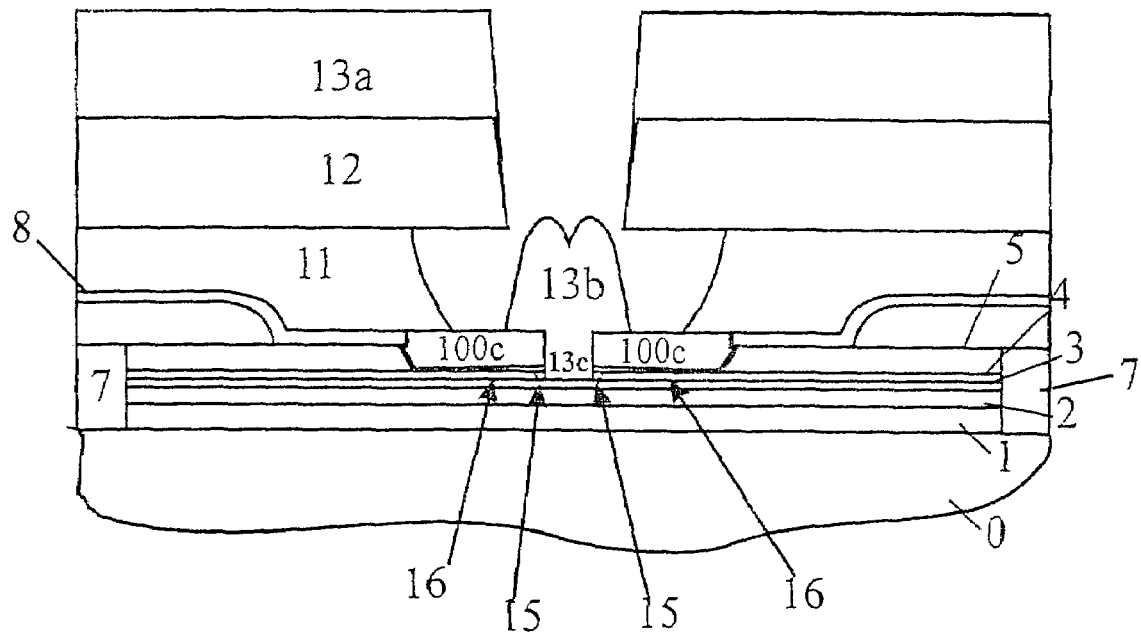

By subsequent plasma back-etching over the entire area, the polymer layer is removed to a great extent, and the additional auxiliary layer 100a is also partially removed (FIG. 1f). Afterwards, the structure of opening 9b in the first auxiliary layer is transferred into polymer layer 100b as an opening 10, and into additional auxiliary layer 90b as an opening 900b. It is advantageous if the first auxiliary layer is completely removed, and the polymer that fills the cavity is exposed as lateral delimitations 100c of opening 10, so that the structure shown in FIG. 1g is formed. During the etching process, the properties of the various materials of the intermediate layer 8, the first auxiliary layer 9, second auxiliary layer 90a, 90b, and of polymer 100a, 100b can be utilized for selective etching, by means of suitable adjustments of the etching parameters.

In the structure shown in FIG. 1g, opening 10 delimited laterally by means of polymer 100c and opening 900b, as a hard mask in the additional auxiliary layer 90b, form the lateral delimitation for subsequent etching of the narrow recess, by means of etching of shielding layer 4 in opening 900b and laterally from it, below additional auxiliary layer 90b.

Before etching of the narrow recess, a mask structure for the gate head is produced in a photolithography process, for the production of the gate head using the lift-off technique. For this purpose, two photo-resist layers 11 and 12 are deposited onto the arrangement shown in FIG. 1g. A lower resist layer preferably consists of PGMI, and an upper resist layer 12 preferably consists of a thin positive resist. After alignment of a photo mask, exposure, and development of the resist layers, an opening that determines the width of the gate head is formed in upper resist layer 12, and a lateral, larger opening is formed in lower resist layer 11.

Before deposition of the gate metal, a narrow recess 15 is produced, using openings 10 in polymer 100c and 900b in additional auxiliary layer 90b, in shielding layer 4, up to barrier layer 3, which recess is broader, by a slight measure, than opening 90b, by means of defined lateral under-etching of the additional auxiliary layer 90b. To the side of the narrow recess, the barrier layer is covered by sections 16 of the shielding layer.

After etching of narrow recess 15, the gate metal is vapor-deposited, forming the gate foot in the narrow recess and openings 900b and 10, and forming gate head 13b of a T-shaped gate electrode above polymer 100c. The upper surface of polymer layers 100c can thereby serve, in advantageous manner, for defined setting of the lower edge of the overhanging lateral region of the gate head. The upper surface of polymer layers 100c essentially coincides with the upper surface of intermediate layer 8 between ohmic contacts 6, and can therefore be pre-determined as early as with the deposition of intermediate layer 8.

After removal of metal layer 13a on photo-resist layer 12 by means of lift-off, polymer 100c, the additional auxiliary layer 90b, and intermediate layer 8 are removed. For this purpose, it is advantageous to use a $CF_4$-based plasma.

Figure 1I:
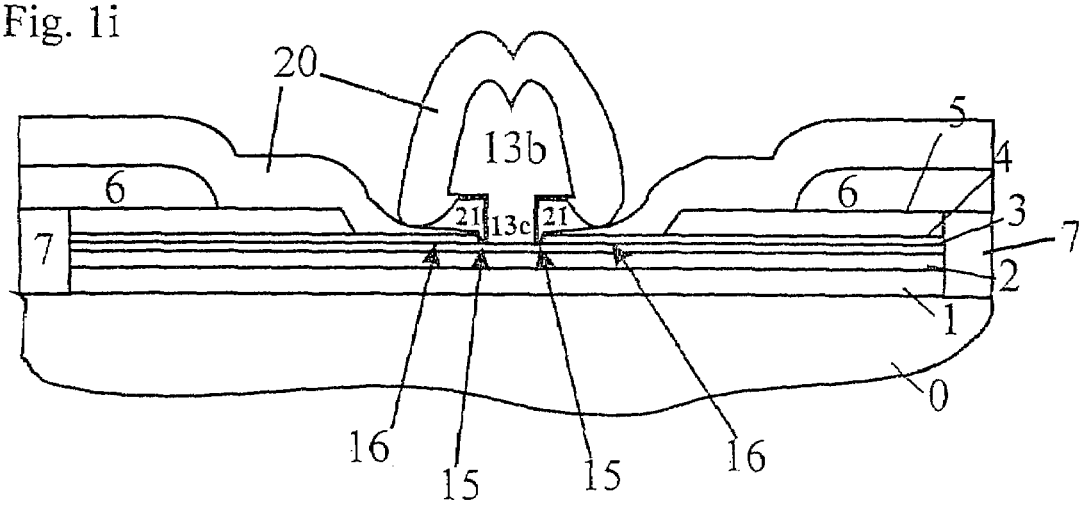

A passivation layer 20, preferably SiN, is deposited over the entire area, particularly also into recess 50, 15 and below the overhanging lateral gate head regions. The passivation layer encloses cavities 21 under the overhanging gate head regions (FIG. 1i). Feed-back capacitances can be reduced in particularly advantageous manner by cavities 21.

The characteristics indicated above and in the claims, as well as those that can be derived from the figures, can advantageously be implemented both individually and in various combinations. The invention is not restricted to the exemplary embodiments described, but rather can be modified in many different ways, within the scope of the skill of a person skilled in the art.

What is claimed is:

1. A method for the production of a microelectronic component of a T-shaped metallic gate electrode, having a gate head and a gate foot that is narrower than the gate head, which is disposed in a double-recess structure, comprising the following steps:

depositing a semiconductor layer sequence for an HEMT transistor, said sequence comprising:
a channel layer;
a low-doped shielding layer above the channel layer; and
a highly doped contact layer above the shielding layer;
depositing at least one first auxiliary layer above the contact layer;
producing a first opening that determines the structure of the gate foot in the first auxiliary layer;
producing a broad recess of the double-recess structure by under-etching the auxiliary layer up to the shielding layer;
depositing dielectric material for another auxiliary layer onto the shielding layer through the first opening;
producing a second opening in the additional auxiliary layer, up to the shielding layer, by anistropic etching, with the first opening as a mask;
producing a narrow recess of the double-recess structure by under-etching the additional auxiliary layer on both sides of the second opening; and
depositing gate metal for the gate foot through the second opening into the narrow recess.

2. A method according to claim 1, wherein the additional auxiliary layer is made of silicon nitride.

3. A method according to claim 1, wherein the additional auxiliary layer is deposited according to a PECVD method.

4. A method according to claim 1, further comprising the steps of:
filling the broad recess with a polymerizable filler after deposition of the additional auxiliary layer; and
polymerizing the filler in the broad recess,
wherein the second opening is also produced in the polymer.

5. A method according to claim 4, wherein the auxiliary layer above the polymer is removed before deposition of the gate metal, and wherein the gate metal for the gate head is deposited onto the polymer.

6. A method according to claim 1, further comprising the step of depositing an intermediate layer between the contact layer and the first auxiliary layer, and wherein etching of the broad recess takes place in two steps: in a first step, an opening that is wider as compared with the first opening is produced in the intermediate layer, under the first auxiliary layer; and in a second step, this opening is used as a mask for etching the broad recess in the contact layer.

7. A method according to claim 1, further comprising the step of depositing at least one resist layer before the step of under-etching the additional auxiliary layer for production of the narrow recess, and producing an opening in this resist layer as a mask for the gate head.

8. A method according to claim 1, further comprising the steps of:
removing the layers that have remained above the semiconductor layers after deposition of the gate metal; and
depositing a passivation layer, having a thickness such that closed cavities are formed below overhanging gate head regions.

* * * * *